United States Patent
Ban et al.

Patent Number: 6,131,052
Date of Patent: Oct. 10, 2000

[54] SEMICONDUCTOR MANUFACTURING NON-PROCESSING APPARATUSES WITH STORAGE EQUIPMENT

[75] Inventors: Cozy Ban; Kiyoshi Demizu, both of Hyogo, Japan

[73] Assignee: Mitsubishi Denki Kabushiki Kaisha, Tokyo, Japan

[21] Appl. No.: 08/789,243

[22] Filed: Jan. 28, 1997

[30] Foreign Application Priority Data

Oct. 8, 1996 [JP] Japan ................................. 8-267022

[51] Int. Cl.⁷ ......................................... G06F 19/00
[52] U.S. Cl. .................. 700/121; 700/112; 700/113; 700/108; 700/120
[58] Field of Search ............... 364/19, 468.19, 364/468.2, 468.15, 468.28, 468.27; 29/564, 711, 712, 430, 593; 700/112, 113, 108, 121, 120; 73/865.9

[56] References Cited

U.S. PATENT DOCUMENTS 3,976,330 8/1976 Babinski et al. ..................... 406/84
4,027,246 5/1977 Caccoma et al. ................... 364/468.28
5,164,905 11/1992 Iwasaki et al. ..................... 264/468.18
5,166,884 11/1992 Maney et al. ........................ 364/468.2
5,551,830 9/1996 Watanabe et al. .

FOREIGN PATENT DOCUMENTS

| 62-143415 | 6/1987 | Japan . |
| 1-125844 | 5/1989 | Japan . |
| 7-29958 | 1/1995 | Japan . |
| WO95/17993 | 7/1995 | WIPO . |

Primary Examiner—William Grant
Assistant Examiner—Iván Calcano
Attorney, Agent, or Firm—McDermott, Will & Emery

[57] ABSTRACT

A semiconductor manufacturing system capable of reducing time required for manufacture of semiconductors with effective use of waiting time of lots in storage equipment is provided. While a lot including a plurality of semiconductor wafers are stored in storage equipment, the semiconductor wafers in the lot are subjected to non-processing steps carried out by non-processing apparatuses such as measuring apparatuses, inspecting apparatuses, and contaminant removing apparatuses.

18 Claims, 12 Drawing Sheets

| STEP | RECIPE | CONDITION | PRIORITY |
|---|---|---|---|
| OXIDE FILM DEPOSITION | 1 | 200Å | a |
| FILM THICKNESS MEASURMENT | 1 | 1 | a |
| NITRIDE FILM DEPOSITION | 1 | 1000Å | a |
| FILM THICKNESS MEASURMENT | 2 | 2 | a |
| FOREIGN MATERIAL REMOVAL | 1 | 1 | b |
| FOREIGN MATERIAL REMOVAL | 2 | 2 | c |
| PHOTOLITHOGRAPHY | 1 | 1 | a |
| INSPECTION | 1 | 1 | b |

FIG.8

| STEP | RECIPE | CONDITION | PRIORITY | RESULT | STANDARD |
|---|---|---|---|---|---|
| OXIDE FILM DEPOSITION | 1 | 200Å | a | 1209s | 1200±60s |
| FILM THICKNESS MEASURMENT | 1 | 1 | a | 210Å | 210±20Å |
| NITRIDE FILM DEPOSITION | 1 | 1000Å | a | 3602s | 3600±60s |
| FILM THICKNESS MEASURMENT | 2 | 2 | a | 1200Å | 1200±50Å |
| FOREIGN MATERIAL REMOVAL | 1 | 1 | b | 90s | 90±5s |
| FOREIGN MATERIAL REMOVAL | 1 | ALL THE WAFERS | c | 1,12,20,5,3,6,7,4,55,80 | <30 |
| PHOTOLITHOGRAPHY | 1 | 1 | a | | |
| INSPECTION | 1 | 1 | b | | 0.3±0.03μm |

| STEP | RECIPE | CONDITION |
|---|---|---|
| OXIDE FILM DEPOSITION | 1 | 200 Å |
| FILM THICKNESS MEASURMENT | 1 | 1 |
| NITRIDE FILM DEPOSITION | 1 | 1000 Å |
| FILM THICKNESS MEASURMENT | 2 | 2 |
| PHOTOLITHOGRAPHY PROCESSING | 1 | 1 |

SEMICONDUCTOR MANUFACTURING NON-PROCESSING APPARATUSES WITH STORAGE EQUIPMENT

BACKGROUND OF THE INVENTION

1. Field of the Invention

The present invention relates to semiconductor manufacturing systems, and more particularly to a semiconductor manufacturing system for processing semiconductor wafers on a lot-by-lot basis, each lot including a plurality of semiconductor wafers.

2. Description of the Background Art

FIG. 11 is a schematic diagram showing the structure of a conventional semiconductor manufacturing line. Referring to FIG. 11, in the conventional semiconductor manufacturing line, processing apparatuses 1a to 1g, measuring apparatuses 2a to 2c, an inspecting apparatus 3a and storage equipment 4 are arranged separately. In the semiconductor manufacturing line, semiconductor wafers are normally subjected to the steps in processing apparatuses 1a to 1g. measuring apparatuses 2a to 2c, and inspecting apparatus 3a on a lot-by-lot basis, wherein about 24 semiconductor wafers form one lot 5. Each lot 5 is stored in storage equipment 4 while being not subjected to the steps in processing apparatuses 1a to 1g, measuring apparatuses 2a to 2c, and inspecting apparatus 3a.

FIG. 12 is a schematic diagram showing one example of a manufacturing flow of the conventional semiconductor manufacturing line. Referring to FIG. 12, in this manufacturing flow, lot 5 (see FIG. 11) is processed in processing apparatus 1a and then transported into storage equipment 4 for waiting. Thereafter, this lot 5 is processed in processing apparatus 1b, measured in measuring apparatus 2a and thereafter transported into storage equipment 4 for waiting. Thereafter, this lot 5 is processed in processing apparatus 1c and then transported again into storage equipment 4 for waiting. Thereafter, the lot 5 took out from storage equipment 4 is inspected in inspecting apparatus 3a. Thus, lot 5 is conventionally kept in storage equipment 4 while not being subjected to the steps in the processing apparatuses, the measuring apparatuses, and the inspecting apparatus.

FIG. 13 is a schematic diagram showing processing conditions of a conventional manufacturing flow for forming a general isolation oxide film. Referring to FIG. 13, in this manufacturing flow, an oxide film having a thickness of 200 Å is first formed in accordance with a recipe (processing condition) 1. Then, the thickness of thus formed oxide film is measured on a condition 1 of recipe 1. Thereafter, a nitride film having a thickness of 1000 Å is formed in accordance with recipe 1 and then the thickness of the nitride film is measured on a condition 2 of a recipe 2. Thereafter, a photolithography processing is carried out on condition 1 of recipe 1.

According to the conventional semiconductor manufacturing line, time necessary for actual manufacturing step accounts for 30% of the total manufacturing time of semiconductor devices, while time for lot 5 to be left in storage equipment 4 for 60%, as shown in FIG. 14, leading to the following problems.

Since a clean room for use in semiconductor manufacturing line requires significant cost for maintenance, unprocessed wafers must be completed with a reduced stay in the clean room. According to the conventional semiconductor manufacturing line, however, lot 5 is just kept in the storage equipment without being processed for 60% of the total time required for completion of semiconductor devices, as described above. Therefore, it is difficult to effectively reduce the total stay of the lot in the clean room, resulting in difficulty in reducing maintenance cost for the clean room.

The inspection and measurement steps are apparently essential for improvement in yield (the rate of acceptable products to the total products obtained) of devices. However, these steps are time-consuming as well as much waiting time in the storage equipment is required for the wafers as described above, and therefore, omission or reduction in the number of the inspection and measurement steps cannot be avoided at the time of actual mass production. Therefore, it is difficult to further improve the yield of devices. Meanwhile, if the inspection and measurement steps are to be provided to improve the yield of devices, time required for these steps must be reduced. This requires the highest-possible-speed image processing system and a robot to be provided in the inspecting apparatus for example, leading to increase in cost for the inspecting apparatus. Such increase in cost for the facility results in increase in price of semiconductor devices.

In addition, it is known that a large amount of contaminants such as by-product resulting from processing are attached to the front and rear surfaces, particularly to the rear surfaces of processed wafers. When the wafers are batch-processed by wet cleaning as pre-processing of the subsequent step in the manufacturing flow, the above-mentioned contaminants are transferred onto the surface of an adjacent wafer. The step of removing contaminants must be included in order to prevent such a state, but in the conventional example, the step of removing contaminants cannot help being omitted at the expense of yield of products so as to reduce the total manufacturing time, as described above. Consequently, it has been difficult to increase yield of products.

SUMMARY OF THE INVENTION

It is an object of the present invention to provide a semiconductor manufacturing system capable of achieving reduction in manufacturing time of semiconductor devices.

It is another object of the present invention to provide a semiconductor manufacturing system capable of providing inspection and measurement steps required for improvement in yield while reducing manufacturing time of semiconductor devices.

According to one aspect of the present invention, a semiconductor manufacturing system for processing semiconductor wafer on a lot-by-lot basis each lot including at least a semiconductor wafer includes a plurality of processing apparatuses, storage equipment, and a plurality of non-processing apparatuses. Each processing apparatus processes semiconductor wafer of a lot. The storage equipment keeps the semiconductor wafers in the lot while they are not being processed in the processing apparatuses. The non-processing apparatuses are provided in cooperation with the storage equipment and carries out either one of inspection, measurement, and removal of contaminants except processing of the semiconductor wafer of the lot. Then, the semiconductor wafer of the lot is subjected to the non-processing steps by the non-processing apparatuses while the lot is being kept in the storage equipment. Thus, in the present invention according to the above-mentioned one aspect, the semiconductor wafer of the lot is subjected to the non-processing steps by the non-processing apparatuses for carrying out either one of inspection, measurement, and removal of contaminants while the lot is kept in the storage equipment, whereby the time for keeping the lot in the storage equipment can be effectively used in inspection, measurement or the like. Therefore, the manufacturing time of semiconductors can be reduced by the time required for the inspection and measurement steps, as compared with the case where the time for the inspection and measurement steps are provided in addition to the waiting time in the storage equipment. In addition, inspection, measurement, removal of contaminants or the like is carried out within the waiting time in the storage equipment, whereby these non-processing steps can be performed as much as possible so long as the semiconductor wafer is kept in the storage equipment, achieving improvement in yield of the devices while reducing manufacturing time.

Preferably, the storage equipment includes a storage region for storing a lot, and an additional function region for accommodating at least one non-processing apparatus. With such a structure, the lot can be easily subjected to inspection, measurement or the like while being stored in the storage equipment.

Preferably, information managing means connected to the processing apparatuses and the non-processing apparatuses for managing information on the processing apparatuses and the non-processing apparatuses is further provided. A computer provided in the storage equipment and a host computer provided outside thereof for example can be used as information managing means. With such information managing means, the processing apparatuses and the non-processing apparatuses can be easily followed in terms of a state of the step carried out thereby or the like.

Preferably, a storage medium, means for reading information, and control means are further provided. The storage medium is provided for each lot, and stores the contents of the previous and subsequent steps of the step of interest. The reading means reads information stored in the storage medium. The control means controls movement of a lot based on the information stored in the storage medium. Thus, the storage medium is provided for each lot and movement of the lot is controlled based on the information stored in the storage medium, whereby semiconductor devices can be efficiently manufactured in consideration of a processing state or the like of each manufacturing apparatus.

Preferably, means for prioritizing the non-processing steps carrying out either one of inspection, measurement, and removal of contaminants is further provided. Then, the semiconductor wafer in the lot is subjected to the non-processing steps based on the content set by the prioritizing means. With such a structure, the non-processing steps such as inspection can be carried out within the waiting time of the lot in the storage equipment according to the degree (priority) to which the step contributes to improvement in yield while the lot is being stored in the storage equipment.

Preferably, examining means, waiting time calculating means, and step order deciding means are further provided. The examining means examines an operation state of the step subsequent to the non-processing step. The waiting time calculating means calculates the waiting time in the storage equipment based on the examination result by the examining means. The step order deciding means decides the order of non-processing steps based on the calculated waiting time. With such a structure, a suitable non-processing step can be carried out according to the waiting time in the storage equipment.

Preferably, yield calculating means and step deciding means are further provided. The yield calculating means calculates the yield of the lot based on the results of inspection and measurement in the non-processing steps. The step deciding means decides the following step of the lot based on the calculation result of the yield calculating means. The yield of the lot is thus calculated during manufacture and the following step of the lot is determined based on the calculation result, whereby the step of the lot having low yield can be interrupted for example to reduce unnecessary manufacture, achieving improvement in manufacturing efficiency.

Preferably, step condition deciding means and changing means are further provided. The step condition deciding means decides a condition of the step subsequent to the non-processing, based on the result of inspection and measurement in the non-processing steps. The changing means changes step condition data based on the result of the step condition deciding means. The condition of the subsequent step is thus decided based on the result of the non-processing steps such as inspection and measurement, whereby the priority of the lots can be changed, achieving more efficient manufacture.

Preferably, means for writing data of the result of the steps carried out by the processing apparatuses and the non-processing apparatuses to a storage medium for the lot while the lot is waiting in the storage equipment is further provided. With such a structure, time-consuming operation of writing to the storage medium can be carried out efficiently.

Preferably, detecting means and displaying means are further provided. The detecting means detects time-series variation in device characteristics on a lot-by-lot basis based on the result of inspection and measurement in the non-processing steps. The displaying means displays the result of the detecting means. The time-series variation in device characteristics is thus displayed on a lot-by-lot basis by the displaying means, whereby the manufacturing step managers can easily keep track of the state of each manufacturing step. In this case, failure determining means and transmitting means may further be provided. The failure determining means determines whether the processing apparatus has failed or not based on the result of the detecting means. The transmitting means transmits a warning signal to the processing apparatus when the failure is detected therein by the failure determining means. With such warning signal transmitting means, feedback to the processing apparatus with failure can be readily achieved.

Preferably, a case, a gas injecting unit, and replacing means are further provided. The case accommodates at least a semiconductor wafer for one lot, and the gas injecting unit is provided in the case. The replacing means is provided in the storage equipment to replace the atmosphere in the case containing the lot with clean gas injected from the gas injecting unit in the case while the case is kept in the storage equipment. With such means for replacing the atmosphere of the lot while the lot is kept in the storage equipment, reduction in manufacturing time and manufacture in a superior atmosphere can be achieved, thereby improving yield while reducing manufacturing time.

Preferably, means for supplying clean gas containing no impurity into the storage equipment having the semiconductor wafer therein to replace the atmosphere in the storage equipment with a clear atmosphere. Thus, the semiconductor wafer can be manufactured in an excellent atmosphere while reducing the manufacturing time, as in the case described above.

A semiconductor device may be formed by using the semiconductor manufacturing system according to the above one aspect of the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a table showing the manufacturing procedure of a semiconductor manufacturing system according to a fifth embodiment of the invention.

DESCRIPTION OF THE PREFERRED EMBODIMENTS

Embodiments of the present invention will now be described in conjunction with the accompanying drawings.

First Embodiment

Figure 1:
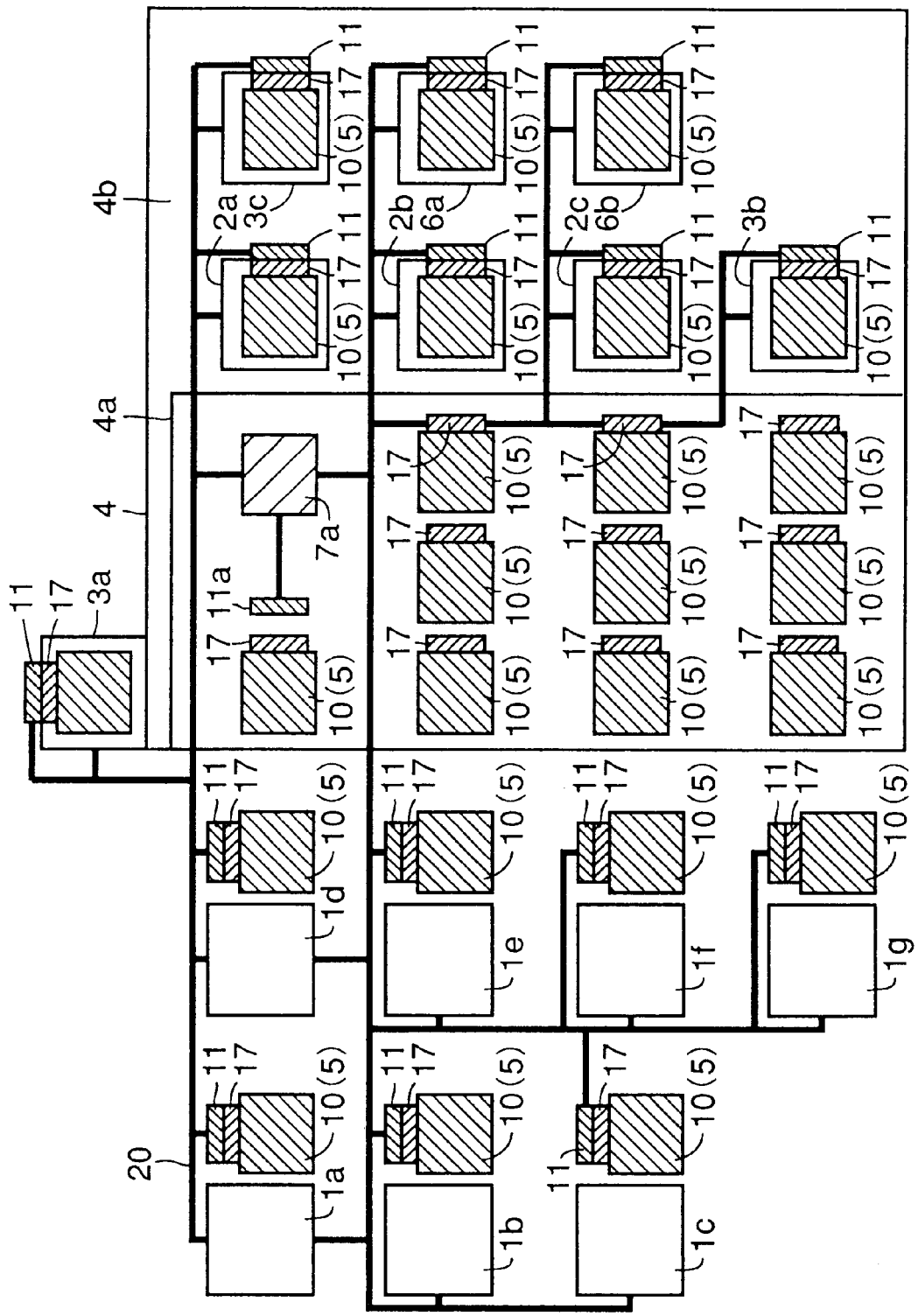
FIG. 1 is a schematic diagram showing a semiconductor manufacturing system according to a first embodiment of the invention.

A semiconductor manufacturing system according to a first embodiment includes processing apparatuses 1a to 1g for processing a semiconductor wafer in a lot 5 as in the conventional example, measuring apparatuses 2a to 2c for measuring the semiconductor wafer, and inspecting apparatuses 3a to 3c for inspecting the semiconductor wafer, as shown in FIG. 1. According to the first embodiment, storage equipment 4 includes a storage area 4a for storing each lot 5, and an additional function area 4b for inspecting and measuring each lot. Additional function area 4b is provided with measuring apparatuses 2a to 2c, inspecting apparatuses 3a to 3c, and contaminant removing apparatuses 6a to 6b. Additional function area 4b may be either provided in storage equipment 4 as shown in FIG. 1, provided directly adjacent thereto, or provided in the vicinity thereof. In addition, these three types may be combined as required.

A computer 7a is provided inside storage equipment 4 as information managing means. Computer 7a is connected to each apparatus (1a to 1g, 2a to 2c, 3a to 3c, 6a, 6b) over a network 20 to transmit and receive data to and from each apparatus. Furthermore, each case 10 for accommodating a cassette holding wafers for one lot is provided with a storage medium 17, and a data reader/writer 11 for reading and writing information from and to storage medium 17 is provided corresponding to each apparatus (1a to 1g, 2a to 2c, 3a to 3c, 6a, 6b). Data reader/writer 11 is connected to network 20. In addition, storage area 4a in storage equipment 4 is provided with a data reader/writer 11a for reading and writing information from and to storage medium 17 for lot 5 stored in storage area 4a. Data reader/writer 11 is connected to computer 7a.

Figure 2:
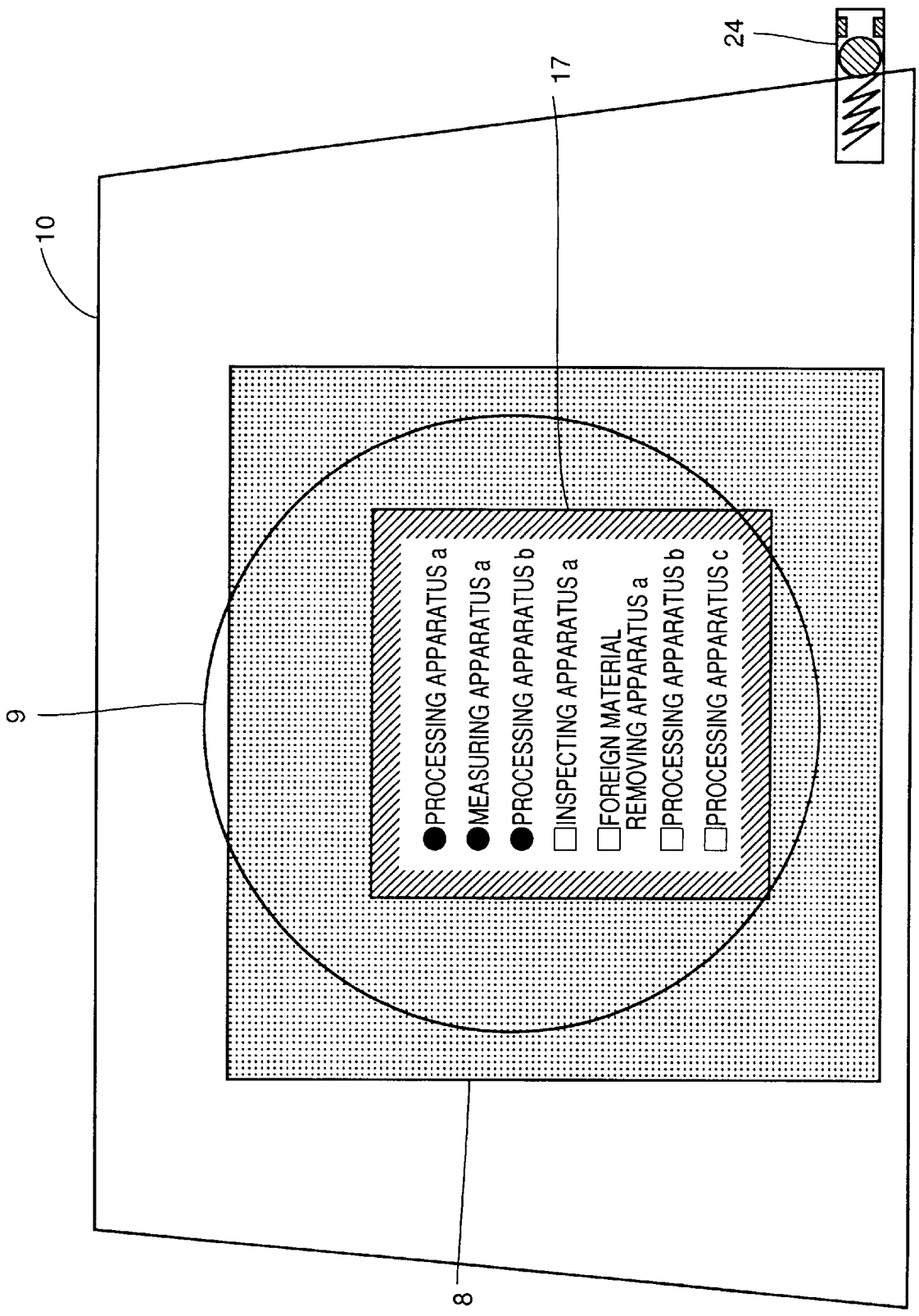
FIG. 2 is a partial enlarged view showing a case for accommodating a semiconductor wafer as shown in FIG. 1 and a storage medium thereof.
Figure 3:
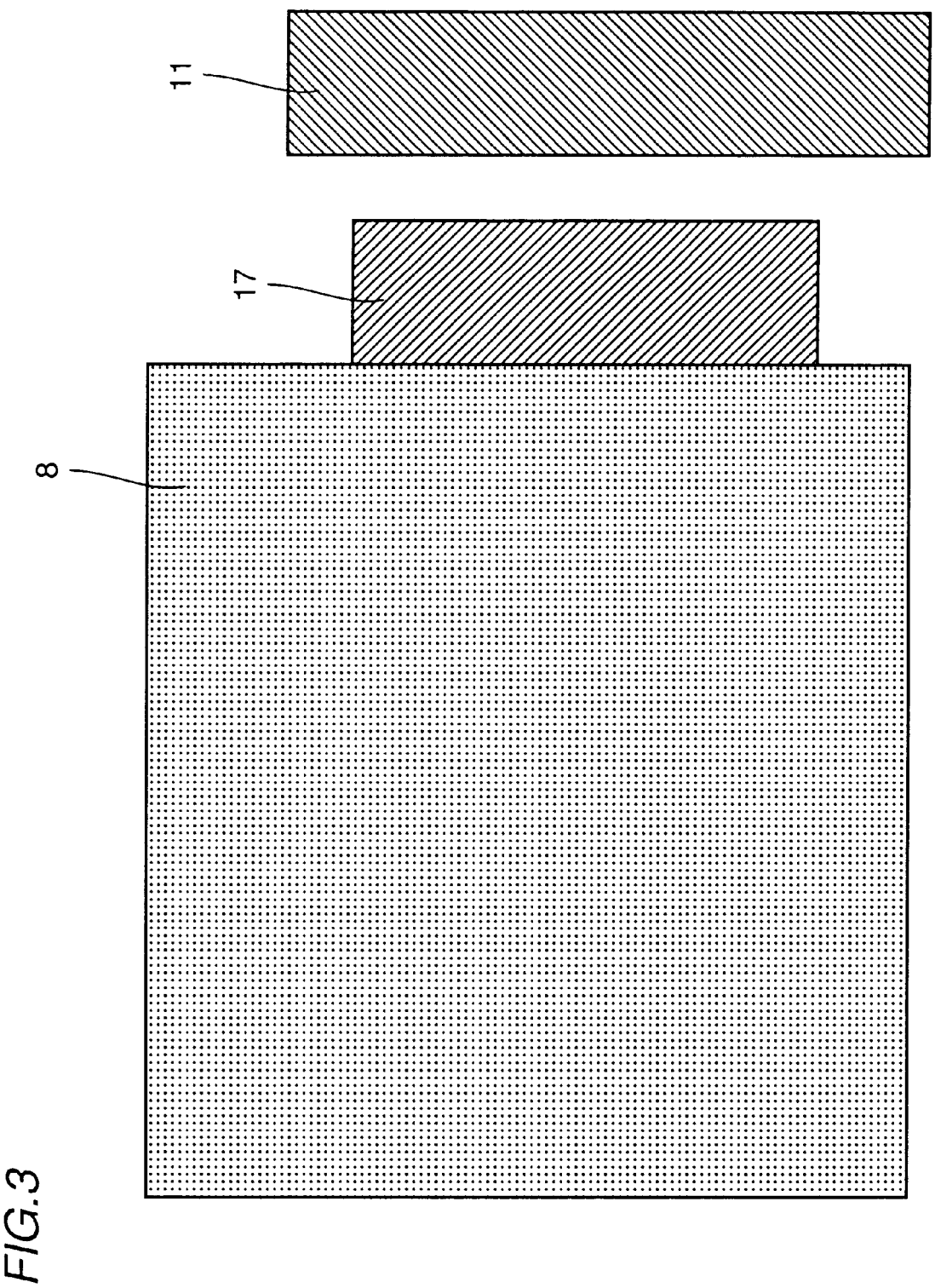
FIG. 3 is a schematic diagram showing the structure in which a storage medium is directly attached to a cassette holding a semiconductor wafer.

Case 10 for accommodating cassette 8 holding wafers, and storage medium 17 are shown in FIG. 2. Referring to FIG. 2, in this example, wafers 9 for one lot are held in cassette 8, and case 10 is provided to enclose cassette 8. Storage medium 17 is provided outside case 10. Storage medium 17 used is of a card type or of types similar thereto, and a single or a plurality of previous and following steps are stored therein. In the example shown in FIG. 3, no case 10 is provided and storage medium 17 is directly attached to cassette 8. Data reader/writer 11 may not be in contact with storage medium 17 as shown in FIG. 3, or may be in contact therewith as shown in FIG. 1.

Figures 13, 14:
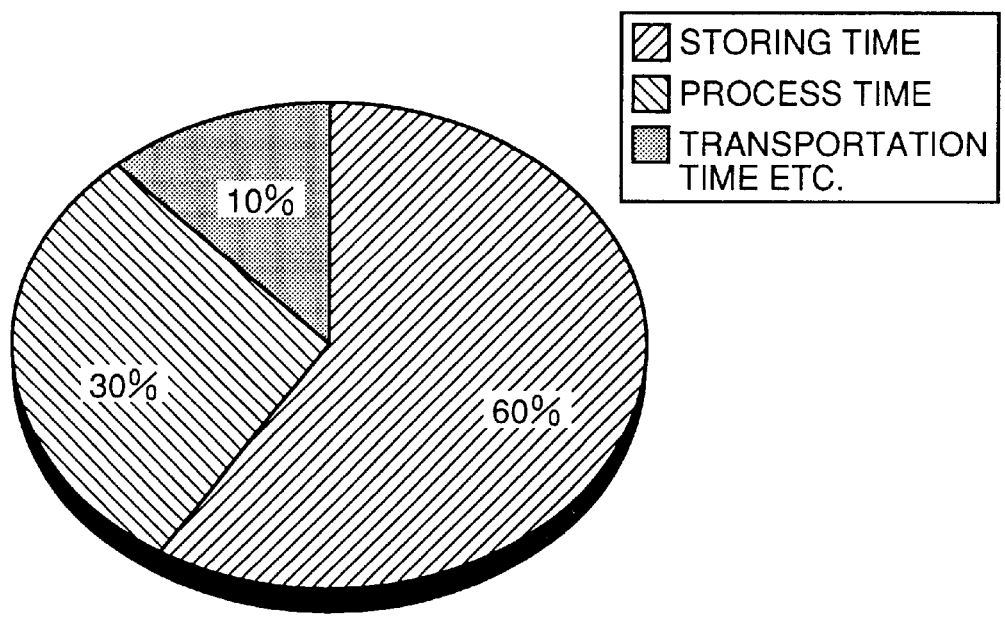
FIG. 13 is a table showing the manufacturing procedure for formation of a conventional general isolation oxide film.
FIG. 14 is a graph for use in illustration of the content of conventional semiconductor manufacturing time.

In the first embodiment shown in FIG. 1, lots 5 are subjected to non-processing steps such as measurement, inspection, and removal of contaminants other than processing steps by means of measuring apparatuses 2a to 2c, inspecting apparatuses 3a to 3c, and contaminant removing apparatuses 6a to 6b while being waiting in storage equipment 4. With such a structure, the non-processing steps such as measurement and inspection can be carried out with effective use of the storing time in the storage equipment which accounts for 60% of the total manufacturing time as shown in FIG. 14. Consequently, manufacturing time can be reduced as compared to the conventional example in which the non-processing steps such as measurement and inspection are carried out separately from the waiting time in storage equipment 4. Furthermore, the total manufacturing time can be reduced and therefore the inspection and measurement steps which could not help being omitted can be provided, thereby effectively improving yield of the products. The operation will now be described in detail.

Referring to FIG. 1, lot 5 is subjected to processing by processing apparatus 1a and then transferred to storage equipment 4. Then, lot 5 is stored in storage area 4a in storage equipment 4. At this time, the subsequent step which has been written to storage medium 17 held at case 10 is verified by data reader/writer 11a. The step following thereto may be verified at the same time.

When that subsequent step has been verified, the state of operation and processing of processing apparatus 1a–1g which is ready for that subsequent step is verified by computer 7a in storage equipment 4. If that subsequent step is ready, the lot 5 is transferred to processing apparatus 1b and processed therein. If data reader/writer 11 is located directly subsequent to processing apparatus 1a, lot 5 may be transferred directly to processing apparatus 1b depending on the case.

After the processing in processing apparatus 1b, lot 5 is transferred back to storage equipment 4. Then, when the subsequent step is similarly verified and there is sufficient waiting time, the lot is subjected to the non-processing step such as inspection step which is designated in storage medium 17 or the like. Since inspecting apparatuses 3a to 3c are provided in additional function area 4b of storage equipment 4, the most appropriate inspecting apparatus is selected therefrom for inspection, taking the step carried out thereby or the like into consideration. A method of selecting which step and apparatus in this case will now be described.

Figures 4, 5:
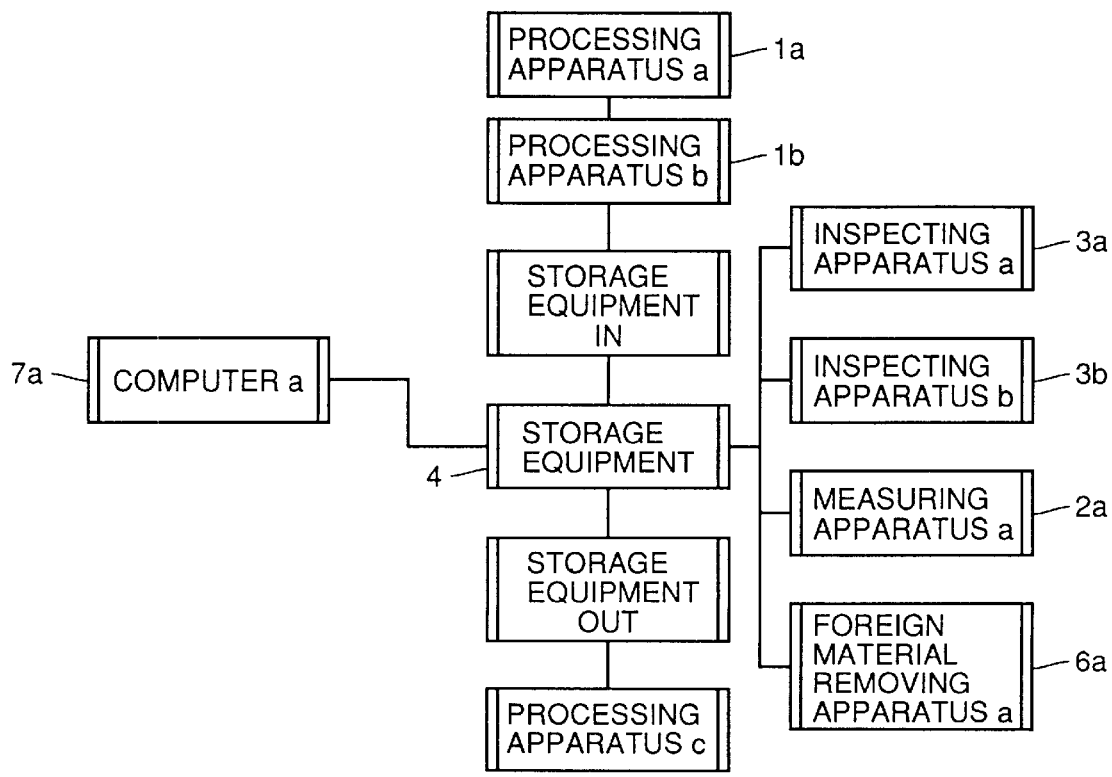
FIG. 4 is a table showing conditions of the manufacturing flow according to the first embodiment of the invention.
FIG. 5 is a diagram showing the manufacturing flow of the first embodiment corresponding to a conventional manufacturing flow shown in FIG. 12.
Figure 12:
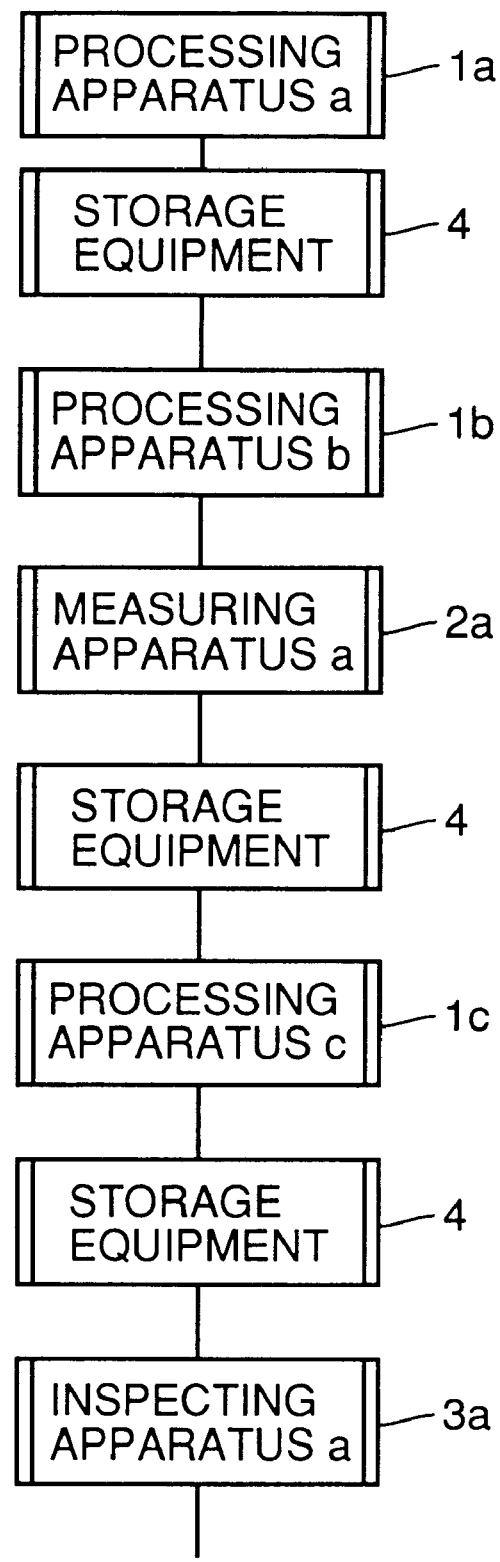
FIG. 12 is a diagram showing the manufacturing flow of the conventional semiconductor manufacturing system shown in FIG. 11.

In the present embodiment, the priority of the non-processing steps such as measurement and inspection steps which are to be carried out during waiting time in the storage equipment 4 for the subsequent step is predetermined. This priority is determined such that (a) the step is always carried out, (b) the step is carried out if the waiting time do not exceed the set time, and (c) the step is carried out if the non-processing apparatus is available for the lot stored in the storage equipment. An example of the predetermined priority is shown in FIG. 4. In addition, a flow chart of the first embodiment corresponding to the conventional flow chart of FIG. 12 is shown in FIG. 5.

Referring to FIG. 4, the measurement and inspection steps are shown with priority, wherein "a" indicates that the step is essential for process control, "b" indicates that the step would be more desirable for improvement in yield, and "c" indicates that the step would be desirable for improvement in yield. Therefore, those steps which are present in the conventional manufacturing flow shown in FIG. 13 are given the priority a to be always carried out.

In addition, a large amount of dust might be produced upon formation of a nitride film, which often results in reduction in yield and causes failure in process at the time of photolithography. Thus, according to the present embodiment, two contaminant removal steps are carried out differently for example one physically and the other chemically after measurement of film thickness subsequent to deposition of the nitride film, as shown in FIG. 4. These contaminant removal steps are carried out in accordance with a recipe 1 and a condition 1, and with a recipe 2 and a condition 2, respectively. After the photolithography, inspection of both accurate/inaccurate photolithography and presence/absence of defects is carried out in accordance with recipe 1 and condition 1. The set time for the contaminant removal and inspection steps may be either uniform such as 45 minutes, or individually different such as 30 minutes for the recipe 1 of the contaminant removal step, 45 minutes for the recipe 2 thereof, and 90 minutes for the inspection step. Furthermore, the space for setting the time of each step may be independently provided in storage medium 17.

In the manufacturing flow shown in FIG. 4, the contaminant removal steps according to the recipes 1 and 2, which are added for improvement in yield, and the inspection step after the photolithography are respectively set to have priority b, c, b so as to be carried out based on the waiting time of lot 5 in storage equipment 4.

More specifically, after an oxide film is deposited, a thickness thereof is measured while the lot is waiting in the storage equipment. Then, a nitride film is deposited and thereafter a thickness thereof is measured while the lot is waiting in the storage equipment.

Before and after each step, storage medium 17 is made to pass in front of card reader/writer 11 provided corresponding to each apparatus in order to store a single or a plurality of previous and subsequent steps. At this time, information on the position of lot 5 is transmitted to computer 7a and at the same time the state of the step or the like of the apparatus to be applied to the subsequent step is verified.

In the present embodiment, both film thickness measurement steps according to the recipes 1 and 2 are set to have priority a and therefore a film thickness is always measured by the film thickness measuring apparatus. The subsequent contaminant removal step according to the recipe 1 is set to have priority b, and therefore, this step according to the recipe 1 is carried out by the contaminant removing apparatus if the waiting time until the photolithography step is for example at least 45 minutes. The subsequent contaminant removal step according to the recipe 2 is set to have priority c, and therefore, this additional step according to the recipe 2 is carried out before the following step if the apparatus which can be applied to the recipe 2 is available, while the lot just waits for that following step, that is, waits for the photolithography step in the storage equipment if not available. Lot 5 which has been subjected to the photolithography step is transferred to storage equipment 4. In this case, the following inspection step stored is set to have priority b, and therefore, it is determined whether the inspection step is to be carried out or not based on the waiting time of lot 5 in storage equipment 4, as in the case of the above-described contaminant removal step according to the recipe 1.

Second Embodiment

In the first embodiment, data is up-loaded and down-loaded before and after each processing step. In this case, it takes at least 10 minutes when the data of the overall steps is rewritten, thereby preventing smooth lot management and causing increase in the total manufacturing time. This means that the wafer stays in the clean room for a long time, which is a significant cause of increase in chip cost.

According to a second embodiment, a computer 7a is provided in storage equipment 4, and therefore, up-loading and down-loading of data or rewriting of data of the step can be carried out within the waiting time for the subsequent step. Thus, the manufacturing time of the devices is reduced, achieving reduction in chip cost.

Third Embodiment

Figure 6:
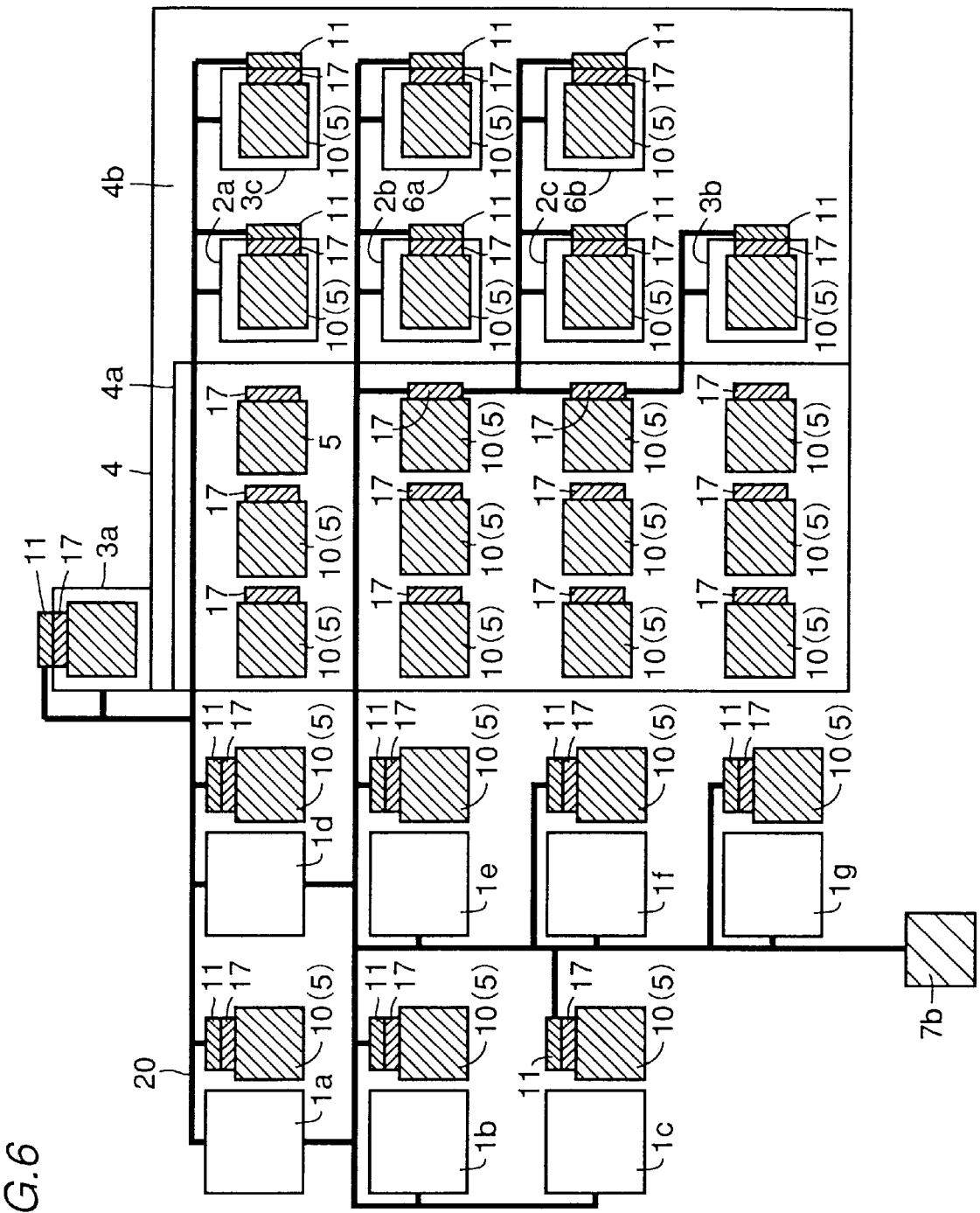
FIG. 6 is a schematic diagram showing a semiconductor manufacturing system according to a third embodiment of the invention.

While network 20 is shown to be established with computer 7a provided in storage equipment 4 in the first embodiment in FIG. 1, a network 20 is established with a host computer 7b serving as information managing means provided outside storage equipment 4 in a third embodiment as shown in FIG. 6. Host computer 7b usually keeps track of not only information on storage equipment 4 and associated apparatuses but also information on the state of the operator in the manufacturing line or the like, and therefore, a wider range of information can be managed in the present embodiment. As a result, the manufacturing line can be controlled as if it were a single apparatus.

Fourth Embodiment

In a fourth embodiment, an example of the manufacturing system which achieves smooth movement of a lot 5 within storage equipment 4 is shown. In addition, an example in which data on the process result or the like is down-loaded in a storage medium 17 attached to lot 5, using the waiting time in the storage equipment will be described.

Figure 7:
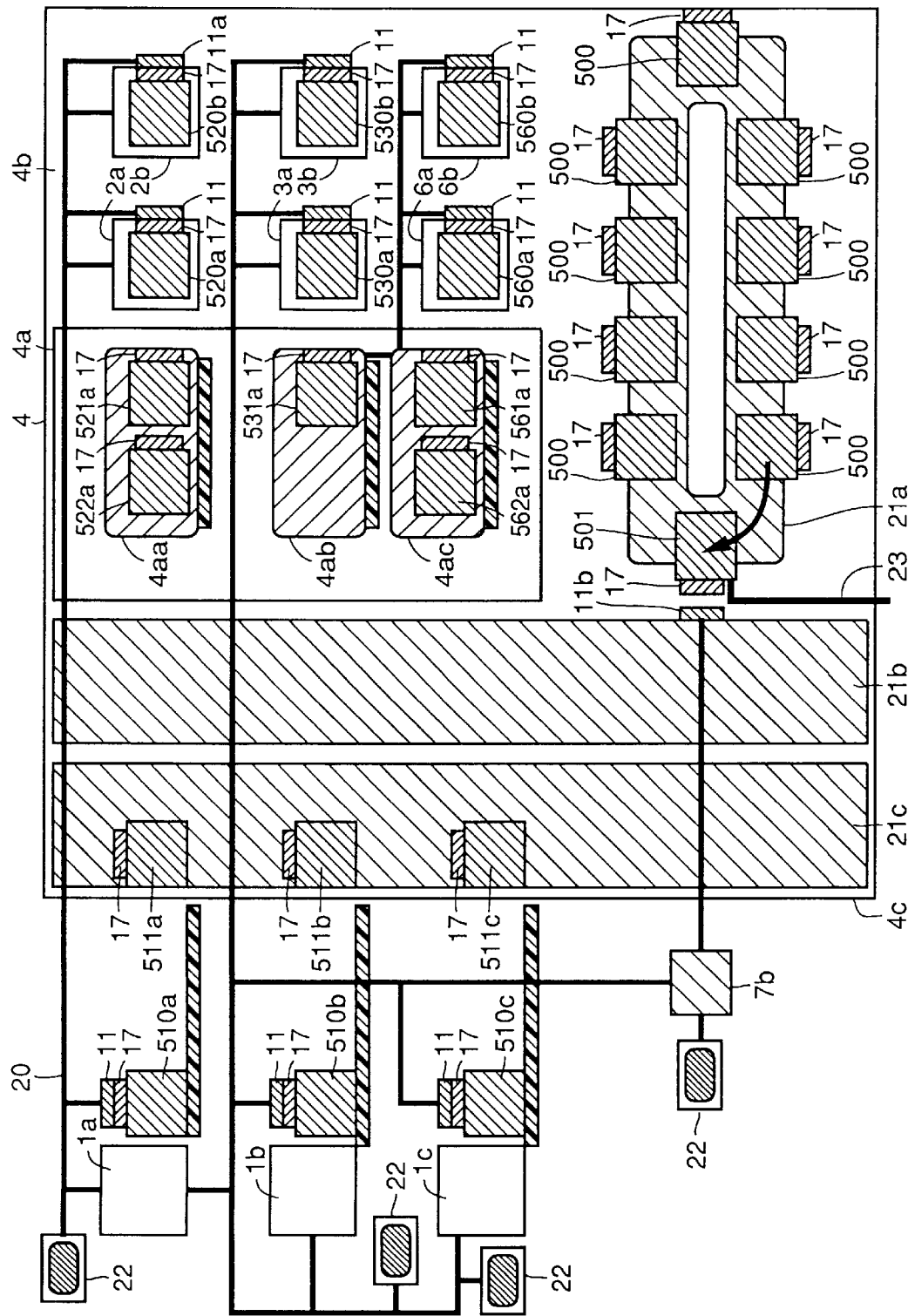
FIG. 7 is a schematic diagram showing a semiconductor manufacturing system according to a fourth embodiment of the invention.

More specifically, a storage equipment turntable 21a is provided in storage equipment 4, as shown in FIG. 7. In addition, stored lots 500 are held on storage equipment turntable 21a. A data reader/writer 11b is provided facing storage equipment turntable 21a, and is connected to a host computer 7b provided outside storage equipment 4. A storage area 4a of storage equipment 4 is divided into three zones, that is, into a measurement step corresponding zone 4aa, an inspection step corresponding zone 4ab, and a contaminant removal step corresponding zone 4ac. A display 22 is provided for each of processing apparatuses 1a to 1c and host computer 7b. Furthermore, conveyers 21b and 21c within the storage equipment are provided in storage equipment 4.

Operation of the semiconductor manufacturing system having the structure shown in FIG. 7 will now be described. Storage equipment turntable 21a is rotated so that a prescribed stored lot 500 is located in front of data reader/writer 11b. With data reader/writer 11b, communication between storage medium 17 and host computer 7b is carried out via a network 20. At this time, data on the manufacturing line or the like stored in host computer 7b is read onto storage medium 17, and data written to storage medium 17 is written to host computer 7b. The data written to host computer 7b is reflected to each apparatus (1a to 1c, 2a, 2b, 3a, 3b, 6a, 6b) across network 20. At the same time, data of host computer 7b and each apparatus is reflected to a lot 501 under reading/writing of data. Thus, data is sequentially down-loaded in all the stored lots 500 stored in storage equipment 4, using available time. At the same time, the subsequent step, apparatus and lot are checked, and the state of the step in that subsequent apparatus is examined.

In the example shown in FIG. 7, processing apparatus 1a processes a lot 510a. A lot to be subjected to the subsequent step in processing apparatus 1a is determined out of storage lots 500 by means of storage equipment turntable 21a, data reader/writer 11b, network 20, and host computer 7b. Then, that lot 500 is transported to the position closest to processing apparatus 1a in storage equipment 4 or to the position in front of processing apparatus 1a by means of conveyers 21b and 21c.

Such an operation is similarly carried out for other apparatuses (1b, 1c, 2a, 2b, 3a, 3b, 6a, 6b). In the case shown in FIG. 7, inspection step corresponding zone 4ab which stores a lot 531a waiting for the step of the inspecting apparatus has available space, and therefore, a lot which is to be subsequently subjected to inspection is detected out of stored lots 500 by host computer 7b. Then, storage equipment turntable 21a is rotated, whereby the detected lot 500 is transported to the available space of inspection step corresponding zone 4ab by means of conveyer 21b. With such an operation, the lot can be smoothly moved within storage equipment 4 for the inspection and measurement steps. In other words, as shown in FIG. 7, storage area 4a in storage equipment 4 is divided into measurement step corresponding zone 4aa, inspection step corresponding zone 4ab, and contaminant removal step corresponding zone 4ac, and stored lots 500 held on storage equipment turntable 21a are sequentially transported into zones 4aa, 4ab, and 4ac, whereby storage lots 500 can be continuously subjected to the steps in storage equipment 4. The same is applied to the case where stored lots 500 to be subjected to the processing the processing apparatuses (1a, 1b, 1c) outside storage equipment 4 are classified.

Note that lots 510a, 510b, and 510c under processing are respectively provided adjacent to processing apparatuses 1a, 1b, and 1c; and on conveyer 21c, the subsequent lots 511a, 511b, 511c are respectively waiting for the processing at the positions corresponding to processing apparatuses 1a, 1b, and 1c. Lot 520a and 520b are being respectively subjected to measurement in measuring apparatuses 2a and 2b within storage equipment 4. Lots 521a and 522a are waiting for the measurement step in measurement step corresponding zone 4aa. Lots 530a and 530b are being respectively subjected to inspection in inspecting apparatuses 3a and 3b, and a lot 531a is waiting for the inspection step in inspection step corresponding zone 4ab. In addition, lots 560a and 560b are being respectively subjected to removal of contaminants in contaminant removing apparatuses 6a and 6b, and lots 561a and 562a are waiting for the contaminant removal step in contaminant removal step corresponding zone 4ac. Note that display 22 displays the state of the apparatuses, the processes or the like.

Fifth Embodiment

A fifth embodiment shows an example of a semiconductor manufacturing system for keeping track of condition and yield of lots based on the result of inspection and measurement to change priority and decide the following step such as "lot out". FIG. 8 is a schematic diagram partially showing the manufacturing flow for the devices according to the fifth embodiment, and FIG. 9 is a flow chart of the manufacturing flow shown in FIG. 8.

Figure 9:
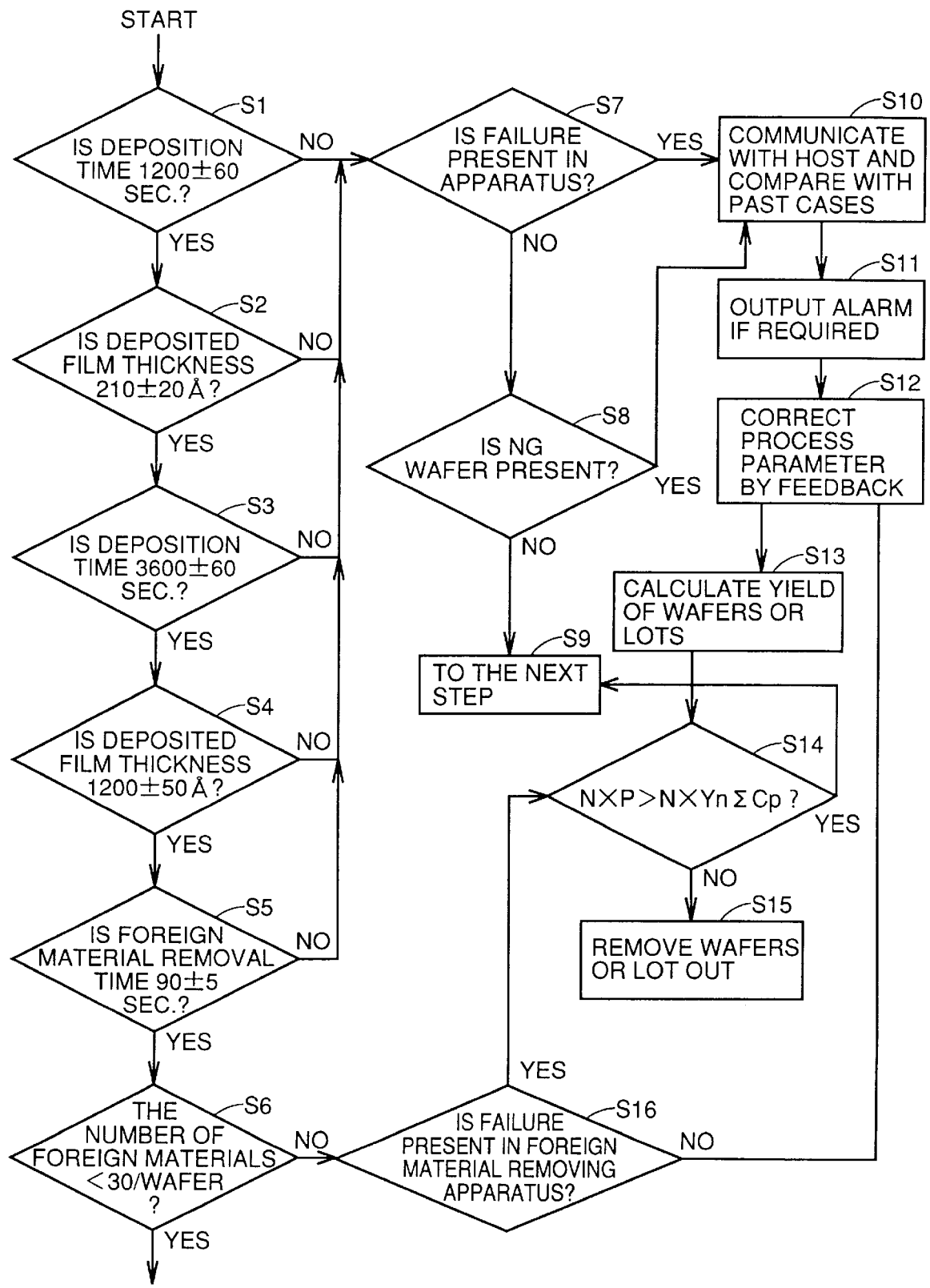
FIG. 9 is a flow chart according to FIG. 8.

Referring to FIGS. 8 and 9, in the fifth embodiment, an oxide film with a thickness of 200 Å is first deposited according to a recipe 1. The standard of the deposition time at this time is 1200±60 seconds, and it is determined in the step 1 (S1) whether the deposition time of the oxide film satisfies the standard or not.

If it satisfies the standard, the lot proceeds to the subsequent step. Otherwise, presence/absence of the failure in the apparatus is verified in S7. If the apparatus has failed, the failure information is transmitted to the host computer in S10 to be compared with the normal variation in process parameter and with the past failure cases. Then, an alarm (failure signal) is output if necessary in S11. The process parameter (manufacturing condition) of the apparatus is corrected by feedback in S12.

At this time, the yield of the wafers or the lots is simultaneously calculated in S13. Then, it is determined in S14 whether or not the wafers or the lot with the calculated yield deserves to be completed in terms of the cost. If not, the wafers are removed or "lot out" is conducted (the manufacture is discontinued) in S15. Whether the calculation of yield is carried out with respect to the wafers or the lots is determined depending on the single-wafer processing or the batch processing. Note that an expression for use in determination in S14 whether the wafers or the lots with the calculated yield deserves to be completed or not in terms of cost will now be described. The yield of chips per wafer can be calculated when the wafer in a step of the manufacturing process has at least a prescribed number of defects. In this case, the yield will not be improved unless the defects are repaired in the following steps.

Assuming that the wafers have been subjected to the nth step. When the number of chips per wafer is indicated with N, the selling price with P, the yield at the end of the nth step with Yn, the cost for each step with Cp, the wafers which do not satisfy the following expression would not result in beneficial products from the n+1th and the following steps. Therefore, in this case, the step should be stopped at that stage.

$$N \times P > N \times Y \Sigma Cp \qquad (1)$$

Such decision is made many times as possible during the waiting time, whereby manufacture causing loss can be stopped. In addition, the yield of each step is accurately followed as in the present embodiment, whereby the number of lots to be placed in the manufacturing line can be planned in an optimum manner.

Meanwhile, when no failure of the apparatus is detected in S7 of FIG. 9, presence/absence of an NG (No Good) wafer is verified in S8. A reference for determination of NG wafer is different for each step, and includes a method of visually verifying the wafer. In the absence of NG wafer, the lot proceeds to the subsequent step in S9. In the presence of NG wafer, the step is returned to S10, wherein the information thereon is transmitted to the host computer to ask for the determination of the host computer.

The thickness of a deposited film (S2), the deposition time (S3), the thickness of a deposited film (S4), and the contaminant removal time (S5) are sequentially determined in a manner similar to that in S1. In addition, the inspection step in S6 determines whether the number of contaminants per wafer is less than 30 or not. If so, the lot proceed to the subsequent step (photolithography processing), and otherwise, presence/absence of failure in the contaminant measuring apparatus is determined in S16. In the presence of the failure in the contaminant measuring apparatus, the process parameter of the apparatus is corrected by feedback in S12. In the absence of the failure therein, it is determined in S14 whether the wafers or the lots with the calculated yield deserve to be completed or not in terms of the cost. If not, the wafers are removed or "lot out" is conducted in S15.

In the device manufacturing line, it is generally more efficient to give priority to the lot which is expected to have higher yield. More specifically, the lot which is expected to have higher yield has higher priority. In addition, the priority may be determined according to the need of the customers, regardless of the yield. Conventionally, the priority of lots is determined at the time of placing them in the manufacturing line, and is fixed until completion of the steps for the lots. In this case, the lot might be damaged in an earlier manufacturing stage by mistake in the process or by failure, leading to 0% yield. Even in such a case, the lot is conventionally processed according to the determined priority, thereby causing a large amount of waste in terms of both the manufacturing line management and the cost.

According to the present embodiment, information on yield can be obtained during waiting time of the lot in the storage equipment between steps, priority of each lot can be changed on a step-by-step basis without wasting time required for each step. The information on the yield and on the state of the apparatus and of the process is analyzed in host computer 7b to be displayed on display system 22 shown in FIG. 7 across network 20. While this display system 22 is shown as CRT (Cathode Ray Tube), PDP (Plasma Display Panel) or LD (Liquid Display) may be used.

Sixth Embodiment

In the present embodiment, data is transmitted and received during available time in the storage equipment and yield is calculated based on the data. Then, the plan of the number of lots to be placed in the manufacturing line or the like is adjusted based on the calculated yield. In the above-described fifth embodiment, the yield Yn at the end of the nth step is held by host computer 7a. Assuming that the device is completed at the end of the mth step, the total number of steps is m. Assuming that the lot is now subjected to the nth step of the total m steps, wherein an average value resulting from statistical processing of actual measurement values of the yield at the end of the nth step is indicated with Y (m, n), and an actual measurement value of the yield at the end of the nth step is indicated with $Y_n$ (m, n), and a predicted value of the final yield calculated from the actual measurement value $Y_n$ (m, n) and a value of the yield at the end of each remaining step is indicated with $Y_m$ (m, n). The value of the yield of each remaining step is calculated from the state of each apparatus which has been up-loaded in the host computer. The predicted yield of a lot which has been finished through the m steps is given by the following equation (2) using the above-mentioned $Y_n$ (m, n) and $Y_m$ (m, n).

$$Y_m(m, n) = Y_m(m,n) \times [Y(m,n+1) \times Y(m,n+2) \times \ldots \times Y(m,m)] \quad (2)$$

The number of lots of the devices of a certain type placed in the manufacturing line is herein indicated with $1_a$, wherein the lots is numbered from 1 to $1_a$. In this case, the yield of each individual lot is given by the following equation (3), wherein the number of a lot of interest is indicated with 1.

$$Y_m(m,n)l = Y_n(m,n) \times [Y(m,n30\ 1) \times Y(m,n30\ 2)l \times \ldots \times Y(m,m)l] \quad (3)$$

When the number of acceptable chips required by a deadline is indicated with $N_n$ and the total number of chips per lot with $N_l$, the following expression (4) must be satisfied to obtain the benefit.

$$N_n \leq \sum_{l=1}^{la} N_l \times Y_m(m, n)l \quad (4)$$

Figure 10:
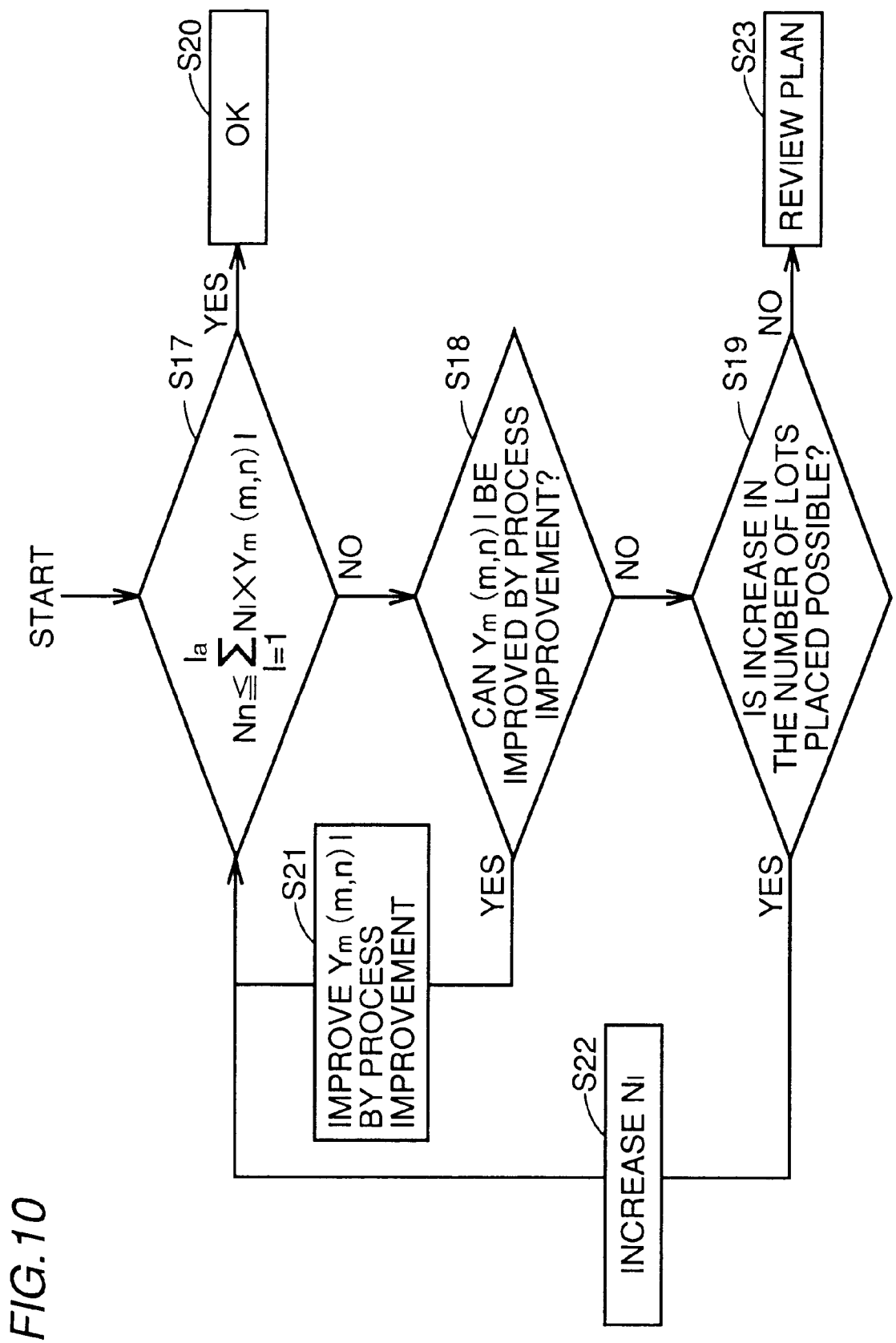
FIG. 10 is a flow chart for use in illustration of the control of a semiconductor manufacturing system according to a sixth embodiment of the invention.
Figure 11:
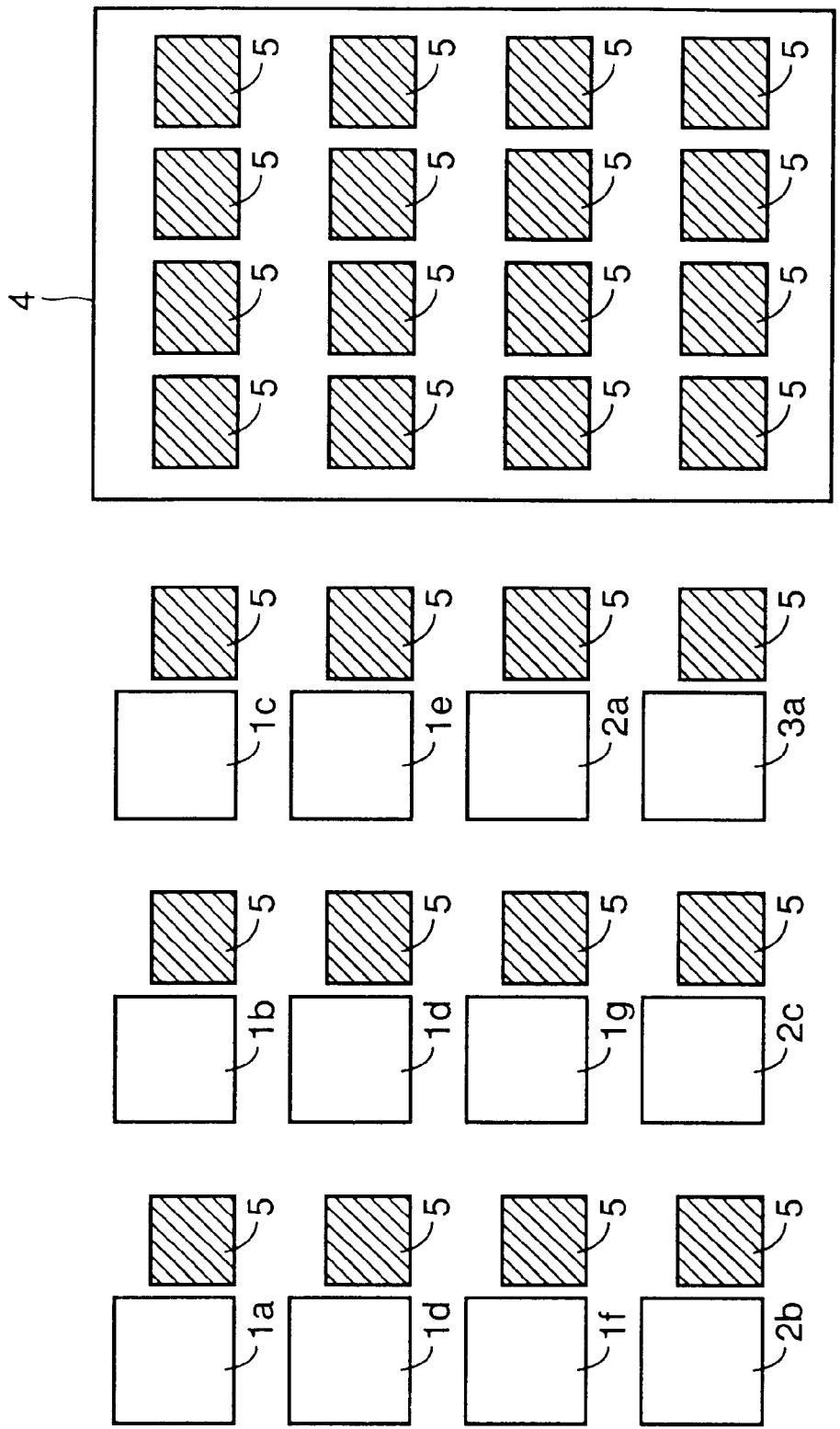
FIG. 11 is a schematic diagram showing a conventional semiconductor manufacturing system.

The flow of the decision using the expression (4) will now be described with reference to FIG. 10. If it is determined from the expression (4) in S17 that the number of acceptable chips produced is equal to or larger than the number $N_n$ of acceptable chips required, the decision "OK" is made in S20. If the number of acceptable chips produced is less than $N_n$, it is determined in S18 whether the yield $Y_m$ (m,n) l of each individual lot can be improved by improvement in process or not. If the yield can be improved, improvement in process is carried out in S21. Otherwise, it is determined in S19 whether the number of lots to be placed in the manufacturing line can be increased or not. If the number of lots can be increased, the number of lots to be placed therein is increased in S22, thereby increasing the total number Nl of chips. Otherwise, the plan of placement of the lots in the manufacturing line is reviewed in S23.1

Seventh Embodiment

In a seventh embodiment, an example in which the surfaces of the wafers in a lot waiting in storage equipment 4 are cleaned will be described in conjunction with FIGS. 2 and 7. As shown in FIG. 2, a purge plug 24 for injecting clean nitrogen and dry air into case 10 enclosing cassette 8 which holds wafers 9 is provided. In addition, as shown in FIG. 7, a purge line 23 for introducing clean nitrogen and dry air into storage equipment 4 is provided. Purge line 23 is provided in the vicinity of turntable 21a in the example of FIG. 7. More specifically, in operation, turntable 21a is rotated so that lot 500 is located near data reader/writer 11b provided in storage equipment 4. When the data communication with host computer 7b is carried out, purge line 23 is simultaneously connected to purge plug 24 in case 10. Then, clean nitrogen and dry air are introduced from purge line 23 into case 10 through purge plug 24, thereby replacing an atmosphere in case 10 therewith. Thus, an atmosphere around the wafers held in cassette 8 within case 10 can be kept clean, whereby growth of a natural oxide film on the wafer surface, and adhesion of foreign materials and contaminants on the wafer surface can be prevented. As a result, lot 5 in the replaced atmosphere in case 10 is transported from storage equipment 4, whereby the lot 5 having cleaner wafer surfaces than those in the conventional example is subjected to the subsequent step. Accordingly, improvement in device characteristics such as direct reduction in contact resistance can be achieved, and at the same time, film separation can be prevented, thereby achieving improvement in yield. Note that in the case where cassette 8 holding wafers 9 is of a type which is not enclosed by case 10, gas containing no impurity is supplied into storage equipment 4 through purge line 23 or the like when cassette 8 is accommodated in storage equipment 4. Thus, an atmosphere in storage equipment 4 can be replaced with clean one, whereby the surface of wafer 9 held in cassette 8 within storage equipment 4 can be cleaned.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor manufacturing system for processing semiconductor wafers on a lot-by-lot basis, each lot including at least a semiconductor wafer, comprising:

a plurality of processing apparatuses for processing the semiconductor wafer of said lot;

storage equipment for storing said lot while said lot is not being processed by said processing apparatuses; and a plurality of non-processing apparatuses provided in cooperation with said storage equipment for applying to the semiconductor wafer of said lot at least one of non-processing steps of inspection, measurement, and removal of contaminants other than the processing by said processing apparatuses, wherein the semiconductor wafer of said lot is subjected to the non-processing steps by said non-processing apparatuses while said lot is stored in said storage equipment, and wherein said storage equipment includes a storage region for storing said lot and an additional function region for accommodating at least one of said plurality of non-processing apparatuses within said storage equipment.

2. The semiconductor manufacturing system according to claim 1, further comprising:

information managing means connected to said processing apparatuses and said non-processing apparatuses for managing information on said processing apparatuses and said non-processing apparatuses.

3. The semiconductor manufacturing system according to claim 1, further comprising:

a storage medium provided for each said lot for storing a content of steps prior and subsequent to a step of interest;

means for reading information stored in said storage medium; and means for controlling movement of said lot based on the information read from said storage medium.

4. The semiconductor manufacturing system according to claim 1, further comprising:

examining means for examining an operation state of a step subsequent to said non-processing step;

means for calculating waiting time of said lot in said storage equipment based on the operation state of said subsequent step; and means for deciding an order of said non-processing steps based on said calculated waiting time.

5. The semiconductor manufacturing system according to claim 1, further comprising:

means for calculating yield of said lot based on a result of inspection and measurement of said lot in the non-processing steps; and means for deciding a subsequent step of said lot based on said calculated yield.

6. The semiconductor manufacturing system according to claim 1, further comprising:

means for deciding a condition of a subsequent step based on a result of inspection and measurement of said lot in the non-processing steps; and changing means for changing step condition data of said subsequent step based on said decided step condition.

7. The semiconductor manufacturing system according to claim 1, further comprising:

means for writing processing result data of said processing apparatuses and step result data of said non-processing apparatuses to a storage medium of said lot while said lot is waiting in said storage equipment.

8. The semiconductor manufacturing system according to claim 1, further comprising:

detecting means for detecting time-series variation in device characteristic of each said lot based on a result of inspection and measurement of said lot in the non-processing steps; and displaying means for displaying a result of said detecting means.

9. The semiconductor manufacturing system according to claim 8, further comprising:

failure determining means for determining whether the processing apparatus has been failed or not based on the result of said detecting means; and means for transmitting a warning signal to said processing apparatus when presence of failure is determined therein by said failure determining means.

10. The semiconductor manufacturing system according to claim 1, further comprising:

a case for accommodating at least a semiconductor wafer for one lot;

a gas injecting unit provided at said case; and means provided in said storage equipment for injecting clean gas from said gas injecting unit at said case to replace an atmosphere in said case therewith while said case accommodating the semiconductor wafer is waiting in said storage equipment.

11. The semiconductor manufacturing system according to claim 1, further comprising:

means for supplying clean air containing no impurity into said storage equipment storing said semiconductor wafer to replace an atmosphere in said storage equipment with a clean atmosphere.

12. A semiconductor manufacturing system for processing semiconductor wafers on a lot-by-lot basis, each lot including at least a semiconductor wafer, comprising:

a plurality of processing apparatuses for processing the semiconductor wafer of said lot, storage equipment for storing said lot while said lot is not being processed by said processing apparatuses; and a plurality of non-processing apparatuses provided in cooperation with said storage equipment for applying to the semiconductor wafer of said lot at least one of non-processing steps of inspection, measurement, and removal of contaminants other than the processing by said processing apparatuses, and a prioritizing means for prioritizing said non-processing steps of inspection, measurement, and removal of contaminants, wherein the semiconductor wafer of said lot is subjected to the non-processing steps by said non-processing apparatuses while said lot is stored in said storage equipment, and wherein the semiconductor wafer of said lot is subjected to the non-processing steps based on a set content of said prioritizing means.

13. The semiconductor manufacturing system according to claim 12, further comprising:

examining means for examining an operation state of a step subsequent to at least one of said non-processing steps;

a wait time calculation means for calculating waiting time of said lot in said storage equipment based on the operation state of the subsequent step; and a queue means for deciding an order of said non-processing steps based on the calculated waiting time and said set content of said prioritizing means.

14. The semiconductor manufacturing system according to claim 12, further comprising:

a calculating means for calculating yield of said lot based on a result of said non-processing steps; and a determining means for deciding a subsequent step of said lot based on said calculated yield.

15. The semiconductor manufacturing system according to claim 12, further comprising:

sensing means for sensing a condition of a subsequent step based on a result of said non-processing steps; and changing means for changing step condition data of said subsequent step based on said sensed step condition.

16. The semiconductor manufacturing system according to claim 12, further comprising:

means for writing processing result data of said processing apparatuses and step result data of said non-processing apparatuses to a storage medium of said lot while said lot is waiting in said storage equipment.

17. The semiconductor manufacturing system according to claim 12, further comprising:

a time-series variation detector for detecting time-series variation in device characteristic of each lot based on a result said non-processing steps; and a display for displaying a result of said detecting means.

18. The semiconductor manufacturing system according to claim 12, further comprising:

a decision means for determining whether a wafer satisfies a predetermined relation based on the result of said detecting means; and a warning device outputting at least a warning signal to said processing apparatus when said predetermined relation is determined not to be satisfied.

* * * * *